(12) United States Patent
Huang et al.

(10) Patent No.: US 11,164,979 B1
(45) Date of Patent: Nov. 2, 2021

(54) SEMICONDUCTOR DEVICE

(71) Applicant: Vanguard International Semiconductor Corporation, Hsinchu (TW)

(72) Inventors: Shao-Chang Huang, Hsinchu (TW); Kai-Chieh Hsu, Taoyuan (TW); Chun-Chih Chen, New Taipei (TW); Li-Fan Chen, Hsinchu (TW); Ching-Ho Li, Hsinchu (TW); Ting-You Lin, Hsinchu (TW); Gong-Kai Lin, Yilan County (TW); Yeh-Ning Jou, Hsinchu (TW); Chien-Hsien Song, Kaohsiung (TW); Hsiao-Ying Yang, Hsinchu (TW); Chien-Chi Hsu, Hsinchu (TW); Fu-Chun Tseng, Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/986,278

(22) Filed: Aug. 6, 2020

(51) Int. Cl.
| *H01L 29/872* | (2006.01) |
| *H01L 29/06* | (2006.01) |
| *H01L 29/66* | (2006.01) |

(52) U.S. Cl.
CPC ........ *H01L 29/872* (2013.01); *H01L 29/0619* (2013.01); *H01L 29/66143* (2013.01)

(58) Field of Classification Search
CPC ... H01L 29/872–8725; H01L 29/66143; H01L 29/061; H01L 2924/12032; H01L 29/66212; H01L 27/0766; H01L 51/0579
See application file for complete search history.

(56) References Cited

U.S. PATENT DOCUMENTS

| 6,524,900 | B2 | 2/2003 | Dahlqvist | |
| 7,851,881 | B1* | 12/2010 | Zhao | H01L 21/0495 |
| | | | | 257/471 |
| 8,664,665 | B2* | 3/2014 | Henning | H01L 29/0619 |
| | | | | 257/77 |
| 2005/0029615 | A1* | 2/2005 | Tanaka | H01L 29/0692 |
| | | | | 257/484 |

(Continued)

FOREIGN PATENT DOCUMENTS

| TW | 511295 | 11/2002 |
| TW | I466183 B | 12/2014 |

(Continued)

*Primary Examiner* — Shahed Ahmed
*Assistant Examiner* — Khatib A Rahman
(74) *Attorney, Agent, or Firm* — Winston Hsu

(57) ABSTRACT

A semiconductor device includes a semiconductor substrate, a Schottky layer, a plurality of first doped regions, a plurality of second doped regions, a first conductive layer and a second conductive layer. The semiconductor substrate includes a first conductive type, and the Schottky layer is disposed on the semiconductor substrate. The first doped regions and the second doped regions include a second conductive type, and which are disposed within the semiconductor substrate. The first doped regions are in parallel and extended along a first direction, and the second doped regions are in parallel and extended along a second direction to cross the first doped regions, thereby to define a plurality of grid areas. The first conductive layer is disposed on the Schottky layer, and the second conductive layer is disposed under the semiconductor substrate.

14 Claims, 10 Drawing Sheets

(56) References Cited

U.S. PATENT DOCUMENTS

| | | | | |
|---|---|---|---|---|
| 2006/0060884 A1* | 3/2006 | Ohyanagi | H01L 29/66416 | 257/133 |
| 2006/0065899 A1* | 3/2006 | Hatakeyama | H01L 29/045 | 257/77 |
| 2006/0255423 A1* | 11/2006 | Ryu | H01L 29/6606 | 257/485 |
| 2007/0228505 A1* | 10/2007 | Mazzola | H01L 29/8611 | 257/471 |
| 2008/0029838 A1* | 2/2008 | Zhang | H01L 29/872 | 257/475 |
| 2008/0093678 A1* | 4/2008 | Lee | G11C 16/0483 | 257/390 |
| 2008/0277669 A1* | 11/2008 | Okuno | H01L 29/0692 | 257/77 |
| 2009/0008651 A1* | 1/2009 | Okuno | H01L 29/6606 | 257/77 |
| 2009/0289262 A1* | 11/2009 | Zhang | H01L 29/0615 | 257/77 |
| 2010/0032730 A1* | 2/2010 | Endo | H01L 29/66136 | 257/280 |
| 2011/0215338 A1* | 9/2011 | Zhang | H01L 29/47 | 257/73 |
| 2012/0256192 A1* | 10/2012 | Zhang | H01L 29/1608 | 257/77 |
| 2014/0077226 A1* | 3/2014 | Kitani | H01L 29/872 | 257/77 |
| 2017/0077218 A1* | 3/2017 | Nishikawa | H01L 29/0619 | |
| 2017/0077220 A1* | 3/2017 | Ohara | H01L 29/0615 | |
| 2020/0006579 A1* | 1/2020 | Quddus | H01L 29/0619 | |

FOREIGN PATENT DOCUMENTS

| | | |
|---|---|---|
| TW | I513009 B | 12/2015 |
| TW | 201911583 A | 3/2019 |

* cited by examiner

SEMICONDUCTOR DEVICE

BACKGROUND OF THE INVENTION

1. Field of the Invention

The present disclosure relates to a semiconductor device, and more particularly, to a semiconductor device having Schottky diode.

2. Description of the Prior Art

The Schottky diode element is a diode which is consisted of a metal-semiconductor junction. The Schottky diode element has been widely used in power converter circuit recently, due to its lower starting voltage in comparison with a PN diode element. However, conventional Schottky diode element also has shortcomings. For example, when a reverse bias is applied to the conventional Schottky diode element, there is seriously high leakage current due to low barrier voltages. Therefore, it is still an urgent need for the industry to further improve the Schottky diode element to meet the practical requirements to gain better functionality.

SUMMARY OF THE INVENTION

One of the objectives of the present disclosure is mainly in improving the disadvantages of the aforementioned Schottky diode element, to avoid the prior art issues.

One embodiment of the present disclosure provides a semiconductor device, which includes a semiconductor substrate, a Schottky layer, a plurality of first doped regions, a plurality of second doped regions, a first conductive layer and a second conductive layer. The semiconductor substrate comprises a first conductive type, and the Schottky layer is disposed on the semiconductor substrate. The first doped regions comprise a second conductive type and disposed in the semiconductor substrate, with the second conductive type being complementary to the first conductive type. The first doped regions are extended parallel along a first direction. The second doped regions comprise the second conductive type and disposed in the semiconductor substrate. The second doped regions are extended parallel along a second direction to cross the first doped regions, wherein the first doped regions are interleaved with the second doped region to define a plurality of grid areas. The first conductive layer is disposed on the Schottky layer, and the second conductive layer is disposed under the semiconductor substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
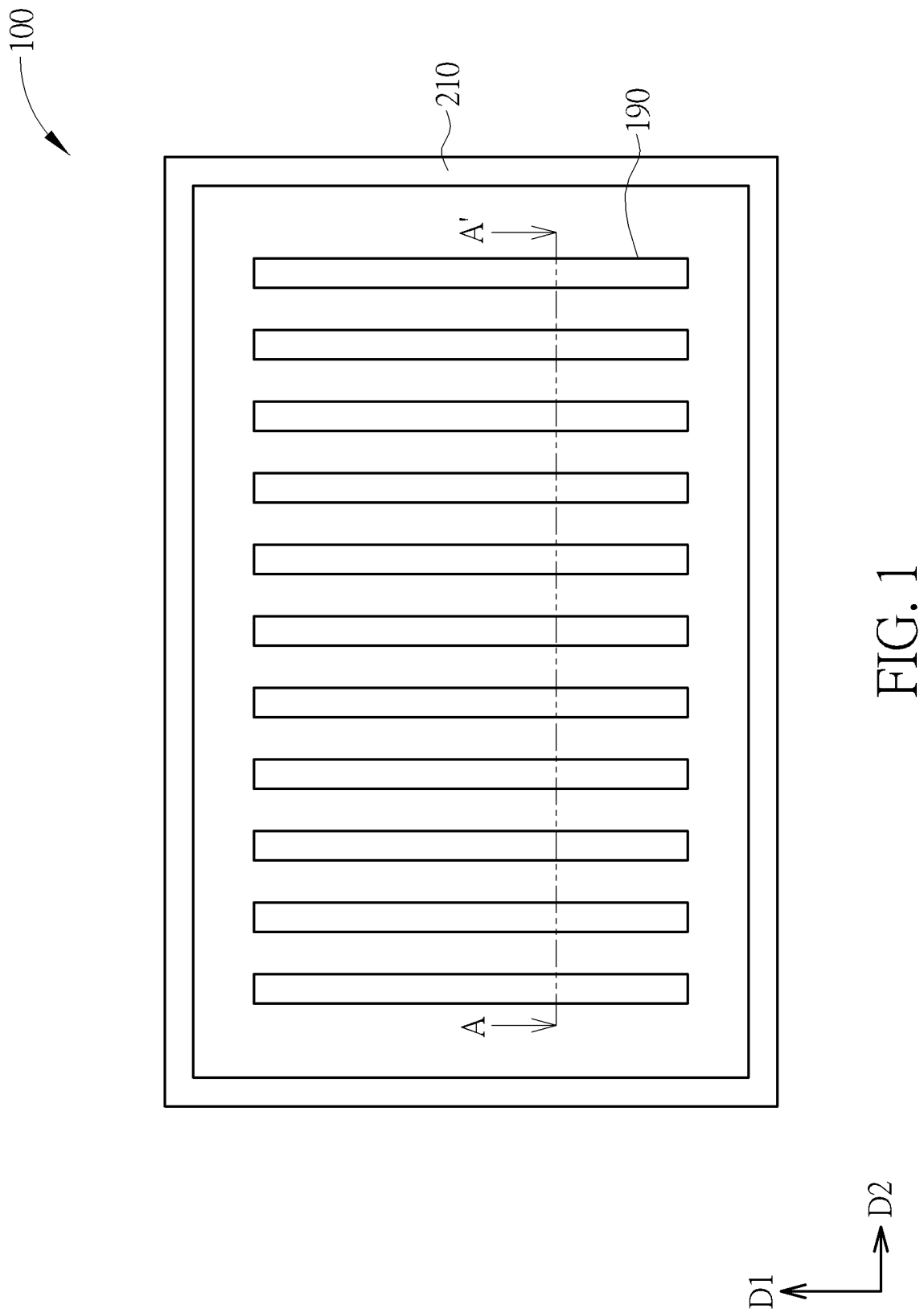
FIG. 1 is a schematic diagram illustrating a top view of a semiconductor device according to a comparison embodiment of the present disclosure.

For better understanding of the presented disclosure, preferred embodiments will be described in detail. The preferred embodiments of the present disclosure are illustrated in the accompanying drawings with numbered elements.

In the present disclosure, the formation of a first feature over or on a second feature in the description may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Furthermore, spatially relative terms, such as "beneath," "below," "lower," "over," "above," "upper" and the like, may be used herein for ease of description to describe one element or feature's relationship to another element (s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, preferably within 10%, and more preferably within 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Figure 2:
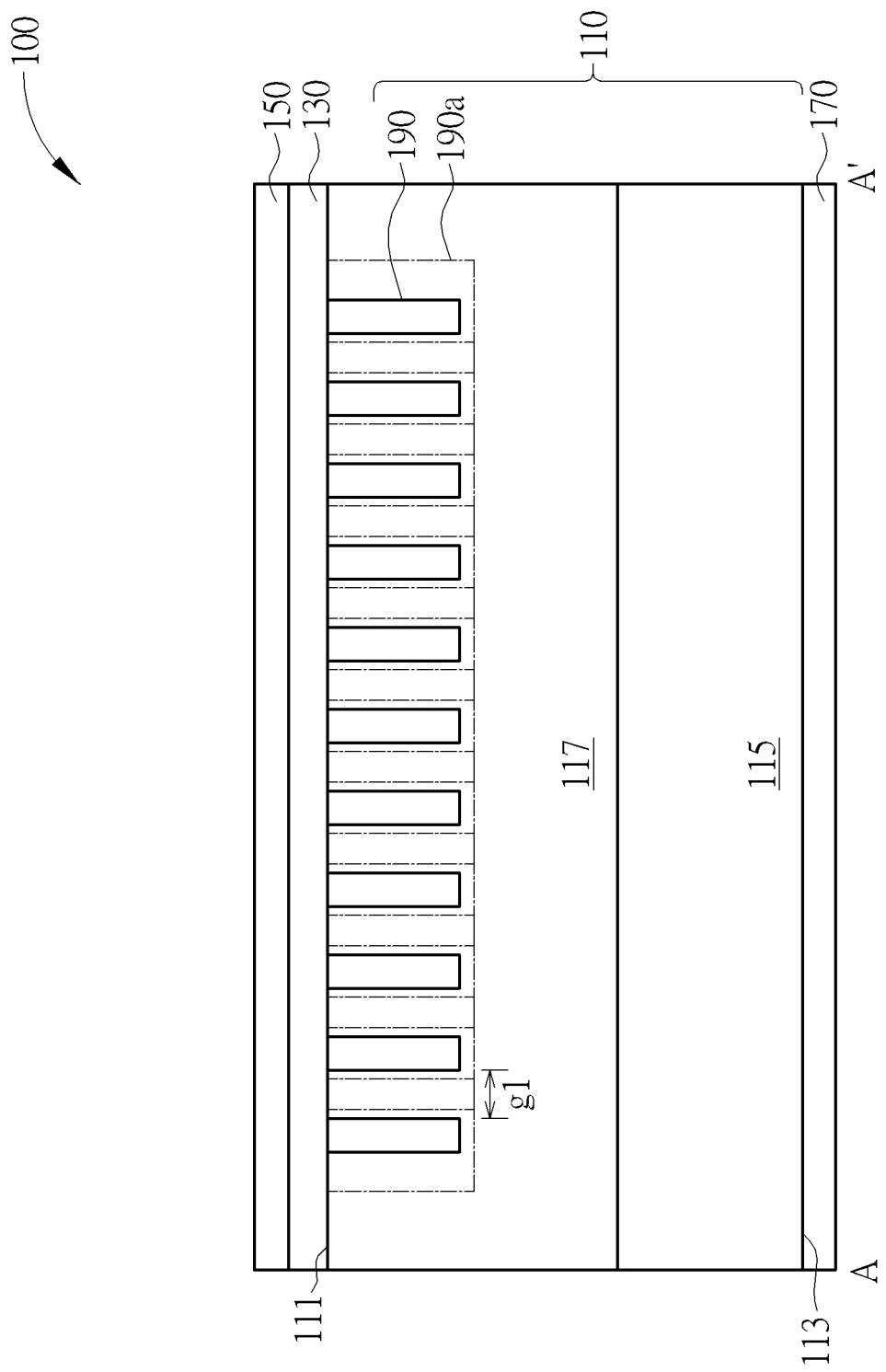
FIG. 2 shows a cross-sectional view taken along a cross line A-A' in FIG. 1.

Please refers to FIG. 1 and FIG. 2, which illustrate a semiconductor device 100 according to the comparison embodiment of the present disclosure, wherein FIG. 1 shows a top view of the semiconductor device 100, and FIG. 2 shows a cross-sectional view of the semiconductor device 100. Firstly, as shown in FIG. 1 and FIG. 2, the semiconductor device 100 includes a semiconductor substrate 110, for example a semiconductor substrate having a first conductive type (such as N-type), but not limited thereto. In the present embodiment, the semiconductor substrate 110 includes a top surface 111 and a bottom surface 113, and the semiconductor substrate 110 includes a silicon substrate 115 and an epitaxial layer 117, with the epitaxial layer 117 being disposed on the silicon substrate 115. The silicon substrate 115 and the epitaxial layer 117 both have the first conductive type (such as N-type), and a doped concentration of the silicon substrate 115 is greater than a doped concentration of the epitaxial layer 117. However, in another embodiment, the material of the semiconductor substrate 110 is not limited to what is mentioned above, and which may also include a monolayer or a multilayer semiconductor substrate consisted of other suitable semiconductor materials. In addition, in one embodiment, a thickness of the epitaxial layer 117 may be further adjusted according to the pressure requirement of the semiconductor device 100. For example, when the epitaxial layer 117 is thicker, the pressure resistance thereof is better, so as to improve the pressure resistance of the Schottky diode element formed subsequently.

A Schottky layer 130 and a conductive layer 150 are sequentially formed on the top surface 111 of the semiconductor substrate 110, and another conductive layer 170 is formed on the bottom surface 113 of the semiconductor substrate 110, so as to configure as a Schottky diode element of the present disclosure. The Schottky layer 130 directly contacts the epitaxial layer 117 underneath, so that a Schottky junction is generated between the Schottky layer 130 and the epitaxial layer 117. The Schottky layer 130 may include a metal material, such as titanium, nickel, platinum, aluminum or a combination thereof, or include a metal silicide material, such as titanium silicide ($TiSi_2$) or nickel silicide ($Ni_2Si$), but is not limited thereto. In another embodiment, the Schottky layer 130 may be a monolayer conductive layer or a multilayer conductive layer based on the practical product requirements. The conductive layer 150 and the conductive layer 170 may include metal material like titanium, nickel or aluminum, respectively, but not limited thereto. Accordingly, the conductive layer 150 disposed on the top surface 111 and the semiconductor substrate 110 may constitutes a Schottky contact, the conductive layer 170 disposed on the bottom surface 113 and the semiconductor substrate 110 may constitutes an Ohmic contact, so that, the conductive layer 150 and the conductive layer 170 may respectively function like an anode and cathode of the Schottky diode element. Furthermore, a guard ring structure 210 may be additionally disposed outside the Schottky diode element, to avoid electrical interference between the Schottky diode element and adjacent elements. In one embodiment, the guard ring structure 210 may be a doped region (not shown in the drawings) formed within the semiconductor substrate 110, and the doped region includes the second conductive type (such as P-type) which is complementary to the first conductive type, with a doped concentration of the doped region being greater than the doped concentration of the epitaxial layer 117.

The Schottky diode element further includes a plurality of doped regions 190, the doped regions 190 are disposed in the semiconductor substrate 110 (namely in the epitaxial layer 117 of the present embodiment), below the Schottky layer 130. The doped regions 190 are disposed adjacent to the top surface 111, to directly contact the Schottky layer 130 disposed above. The doped regions 190 include the second conductive type (such as P-type). In the present embodiment, each of the doped regions 190 is respectively extended along a first direction D1 through a top view as shown in FIG. 1. The doped regions 190 are arranged parallel with each other in a second direction D2, with each of the doped regions 190 being separately from each other by a same gap "g1", and the second direction D2 is for example perpendicular to the first direction D1, but not limited thereto. Also, the semiconductor device 100 further includes a plurality of plugs (not shown in the drawings), and the plugs are formed on the conductive layer 150, being evenly and completely distributed on entire surfaces thereof to form electrical connection.

Through these arrangements, a PN junction (not shown in the drawings) is formed between each of the doped regions 190 and the semiconductor substrate 110 (namely the epitaxial layer 117 of the present embodiment). When a reverse bias (–V) is applied to the Schottky diode element, a depletion region 190a generated by the PN junction may be enlarged correspondingly. Then, the depletion regions 190a generated by each doped region 190 correspondingly may contact to or overlap with each other, as shown in FIG. 2. The depletion regions 190a are in effectively reverse blocking mode, so as to increase the breakdown voltage of the semiconductor device 100. Thus, the reversed leakage current issue of the Schottky diode element may be improved thereby, and the semiconductor device 100 of the present disclosure may achieve better device performance.

One of ordinary skill in the art would easily realize the semiconductor device in the present disclosure is not limited to the aforementioned embodiment, and may further include other examples or variations. For example, in other embodiments, the first conductive type may be P-type and the second conductive type may be N-type, to obtain various type of semiconductor device. The following description will detail the different embodiments of the semiconductor device in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 3:
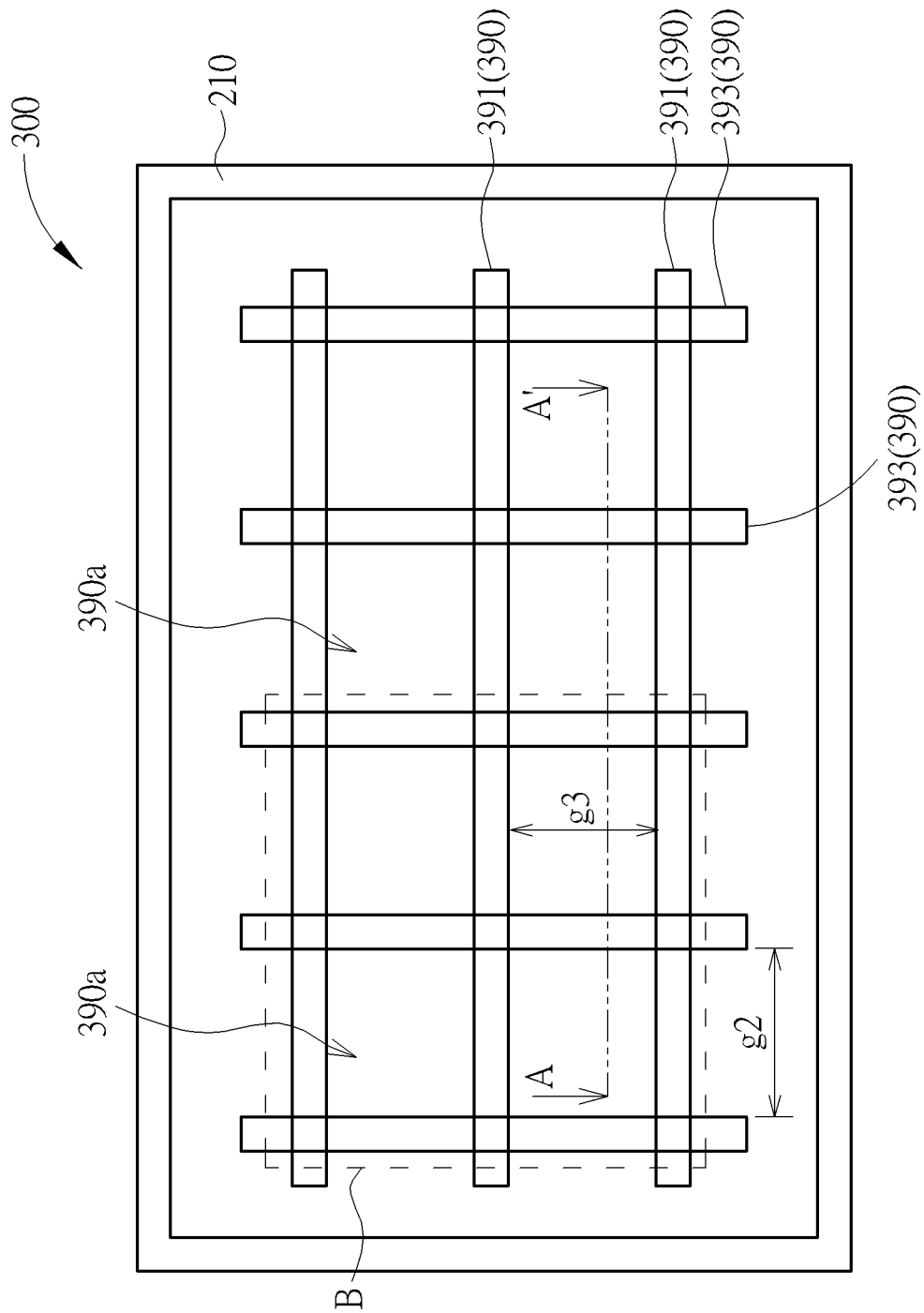
FIG. 3 is a schematic diagram illustrating a top view of a semiconductor device according to a first embodiment of the present disclosure.
Figure 4:
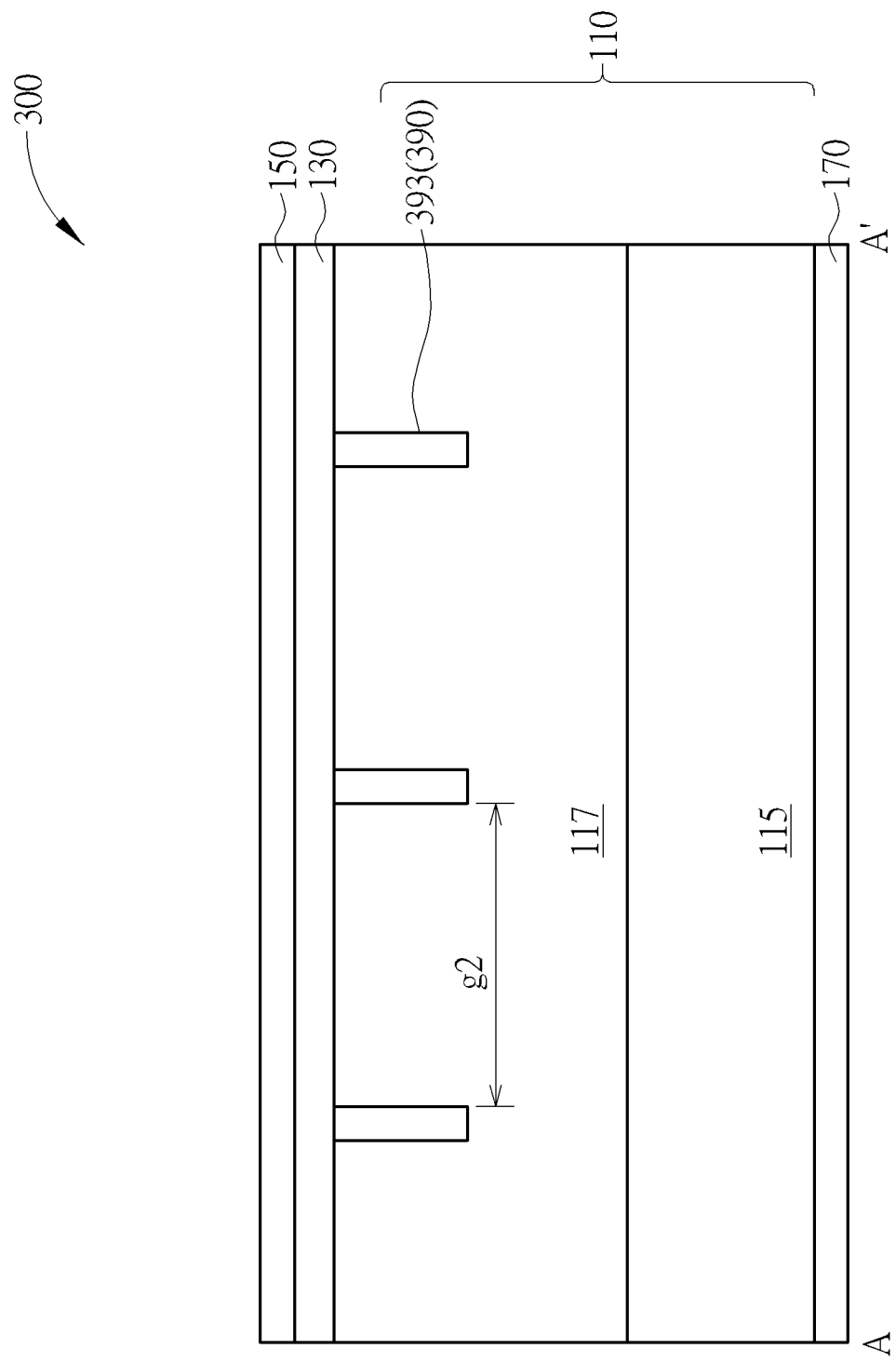
FIG. 4 shows a cross-sectional view taken along a cross line A-A' in FIG. 3.
Figure 5:
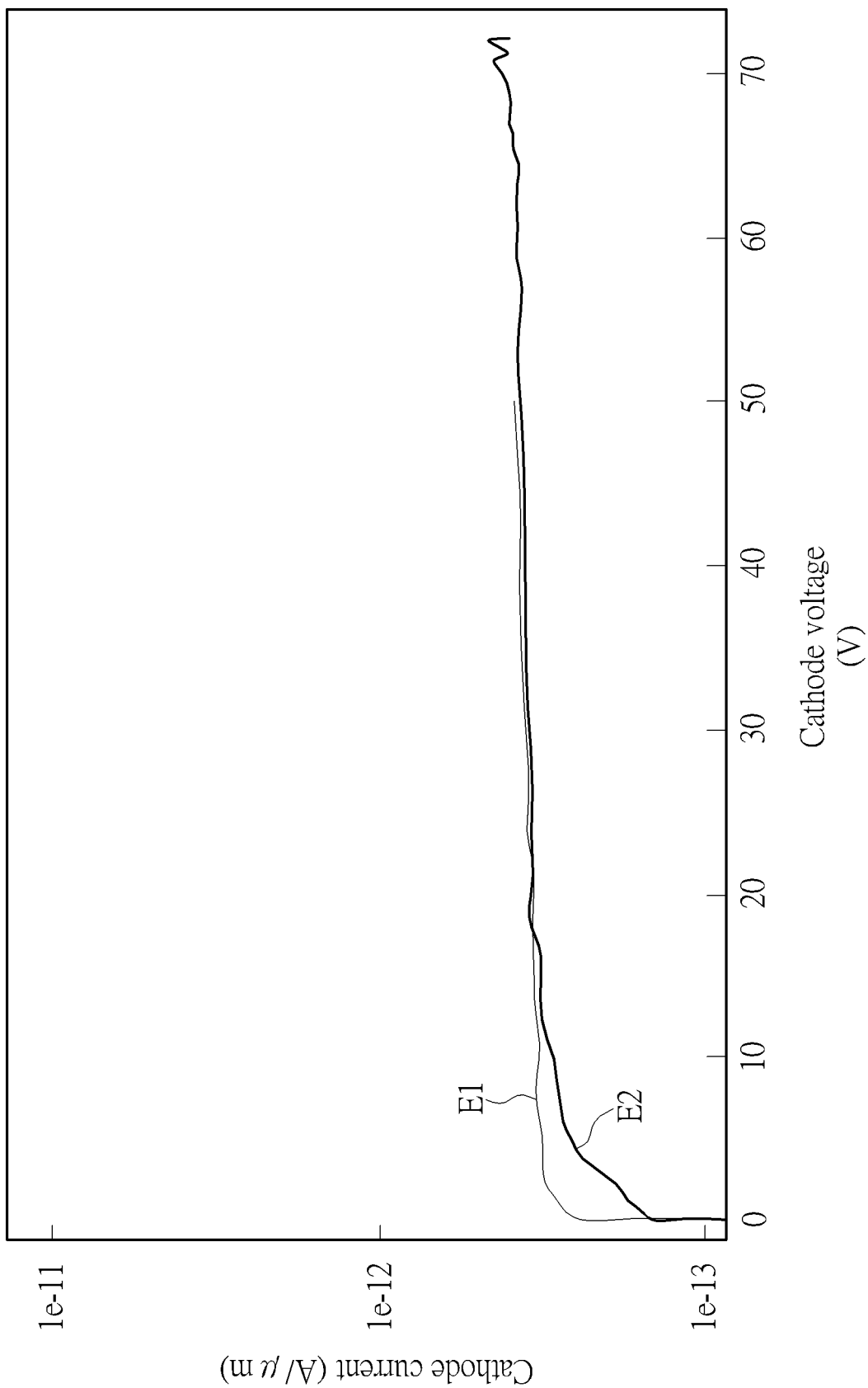
FIG. 5 is a schematic diagram illustrating a computer simulating result of the comparison embodiment and the first embodiment.
Figure 6:
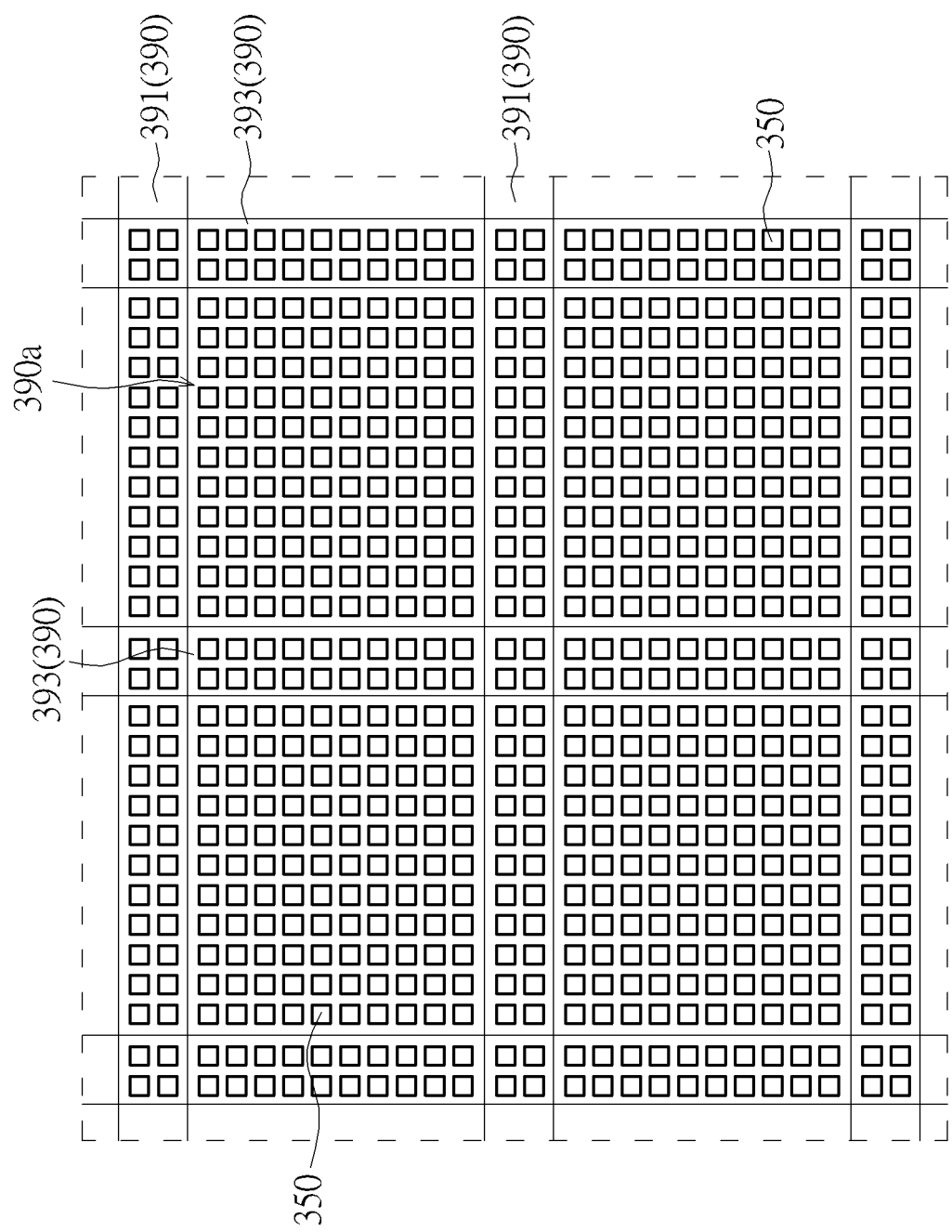
FIG. 6 shows an enlarged view of a dotted frame B in FIG. 3.

According to another embodiment of the present disclosure, a semiconductor device is provided to both achieve the requirements of greater driving current ($I_{on}$) at a forward bias (+V) mode and smaller cutting-off current ($I_{off}$) at a reverse bias (–V) mode, so as to obtain better device function. Please refer to FIG. 3 to FIG. 6, which illustrate a semiconductor device 300 according to a first embodiment of the present disclosure, wherein FIG. 3 shows a top view of the semiconductor device 300 and FIG. 4 shows a cross-sectional view of the semiconductor device 300, and FIG. 6 shows a partial enlarged view of the semiconductor device 300. Features in the semiconductor device 300 of the present embodiment is substantially similar to those in the semiconductor device 100 of the aforementioned embodiment, and which also includes the semiconductor substrate 110 (including the silicon substrate 115 and the epitaxial layer 117), the Schottky layer 130, the conductive layer 150, the another conductive layer 170 and the guard ring structure 210, thereby forming a Schottky diode element. The similarity between the present embodiment and the aforementioned embodiment will not be redundantly described hereinafter. The difference between the present embodiment and the aforementioned embodiment is mainly in that the Schottky diode element of the present embodiment includes a plurality doped regions 390 which are extended along different directions D1, D2 and are interleaved with each other.

Precisely speaking, the doped regions 390 of the Schottky diode element are also disposed in the semiconductor substrate 110 (namely in the epitaxial layer 117 of the present embodiment), adjacent to the top surface 111 and directly contacting the Schottky layer 130 above. The doped regions 390 includes the second conductive type (P-type) and further includes a plurality of first doped regions 391 and a plurality of second doped regions 393. Each of the first doped regions 391 is for example a stripe-shaped doped region extended along the second direction D2, and the first doped regions 391 are arranged parallel along the first direction D1 to separate from each other by the same gap "g3". Each of the second doped regions 393 is for example a stripe-shaped doped region extended along the first direction D1, and the second doped regions 393 are arranged parallel along the second direction D2. In addition, the second doped regions 393 cross to the first doped regions 391 to further define a plurality of grid areas 390a in the semiconductor substrate 110, as shown in FIG. 3. The first doped regions 391 and the second doped region 393 may include the same doped concentration, and each of the second doped regions 393 may also be separately from each other by the same gap "g2", as shown in FIG. 3 and FIG. 4. In the present embodiment, the gap "g2" between each of the second doped regions 393 may be optionally the same as the gap "g3" between each of the first doped regions 391, so that, each of the grid areas 390a may substantially have a square shape, but not limited thereto. Also, in the present embodiment, the semiconductor device 300 further includes a plurality of plugs 350, the plugs 350 are formed on the conductive layer 150. In one embodiment, the plugs 350 are evenly and completely distributed on entire surfaces of the doped regions 390 (including the first doped regions 391 and the second doped regions 393) or the semiconductor substrate 110, as shown in FIG. 6, so as to form electrical connection.

It is noteworthy that, the first doped regions 391 and the second doped regions 393 are extended along different directions D1, D2 respectively to interlace with each other, so that, the doped regions 390 of the Schottky diode element may perform a waffle type layout from a top view as shown in FIG. 3. With such arrangement, a PN junction (not shown in the drawings) is still formed between the doped regions 390 and the semiconductor substrate 110 (namely the epitaxial layer 117 of the present embodiment). When a reversed voltage is applied to the Schottky diode element, a depletion region (not shown in the drawings) generated by the PN junction correspondingly may be enlarged both in the first direction D1 and the second direction D2 simultaneously. Thus, the depletion region generated in the present embodiment may have a relative greater coverage area in comparison with that of the depletion region 190a in the aforementioned embodiment. In this situation, even if the number of the doped region 390 disposed in the same direction is reduced, the depletion region generated correspondingly may still contact to or overlap with each other. As an example, the number of the second doped regions 393 which is disposed in the first direction D1 in the present embodiment is obviously less than the number of the doped regions 190 which is also disposed in the first direction D1 in the aforementioned embodiment, so that, the gap "g2" between each of the second doped regions 393 is greater than the gap "g1" between each of the doped regions 190, as shown in FIG. 3 and FIG. 4. In addition, the number of the first doped regions 391 may be optionally the same or different from the number of the second doped regions 393, and the practical number thereof may be further adjusted based on different product requirements and which is not limited to the number shown in FIG. 3. Preferably, the number of the first doped regions 391 is the same as that of the second doped regions 393, and the gap "g3" between each of the first doped regions 391 is also the same as the gap "g2" between each of the second doped regions 393. In this way, the depletion region with a relative greater area is generated when the sum area of the top surfaces of the first doped regions 391 and the second doped regions 393 is a certain value, thereby effectively reducing the cutting-off current at the reverse bias mode.

Accordingly, the sum area of the doped regions 390 (namely the sum area of the P-type doped regions) may be relatively reduced, and correspondingly, the sum area of the semiconductor substrate 110 (namely the epitaxial layer 117 of the present embodiment) without disposing the doped regions 390 (namely, the sum area of the N-type doped regions) may be relatively increased thereby, for example being increased about 10% to 20%, preferably being about 11%, in comparison with that of the semiconductor device 100 of the aforementioned embodiment, but not limited thereto. Through these arrangements, the semiconductor device 300 of the present embodiment may obtain a greater driving current at a forward bias mode due to the increased coverage area of the semiconductor substrate 110, and also obtain a smaller cutting-off current at the reverse bias mode due to effectively disposing the doped regions 390, thereby achieving better device performance. Please refers to FIG. 5, a computer simulating result of leakage current degree of the semiconductor device 100 (E1) and the semiconductor device 300 (E2) are shown when the reversed voltage is applied to the semiconductor device 100 and the semiconductor device 300. It is noted that, the high leakage current issue is effectively improved in the semiconductor device 300 of the present embodiment.

Figure 7:
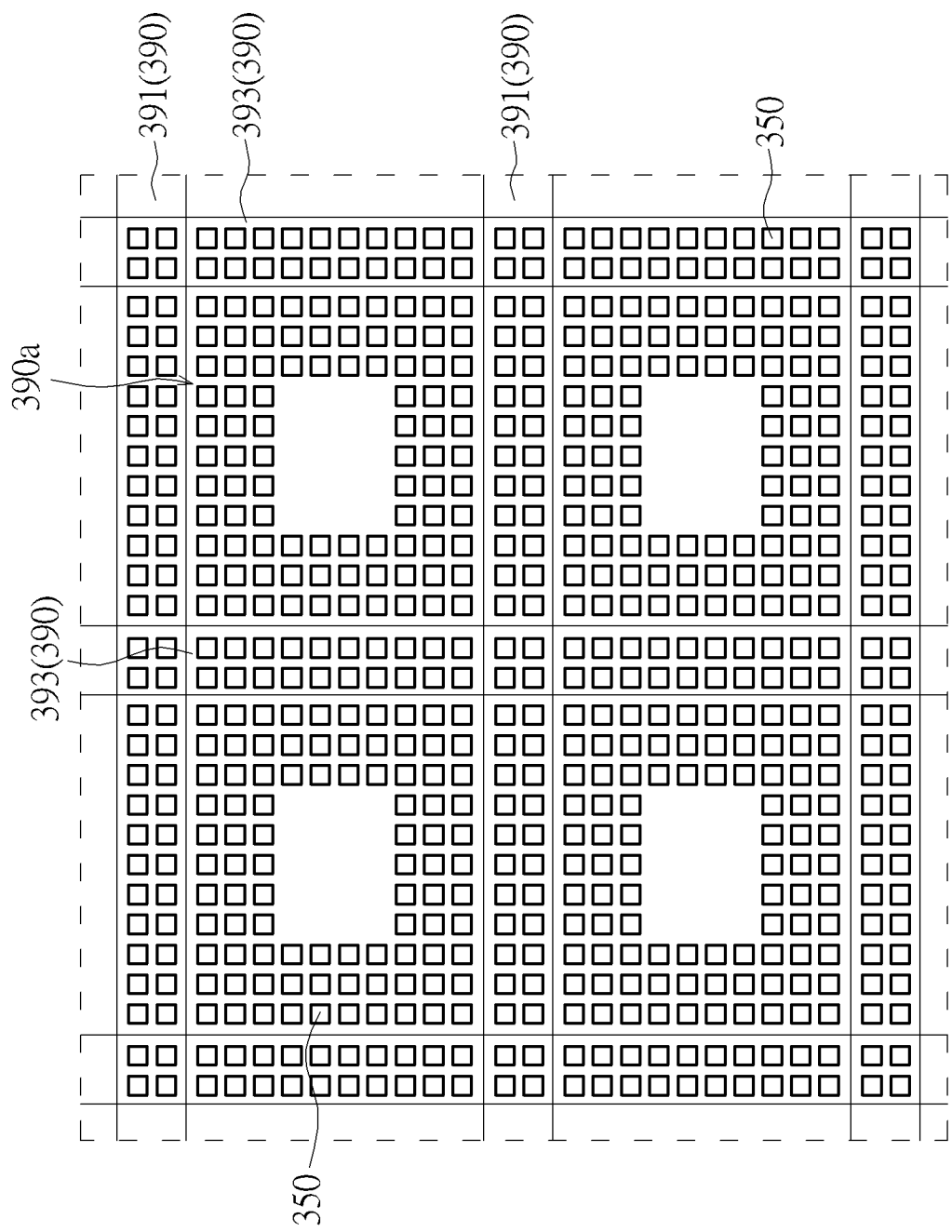
FIG. 7 is a schematic diagram illustrating the disposing of plug within a semiconductor device according to a first embodiment of the present disclosure.

Furthermore, the disposing of the plug 350 in the semiconductor device 300 of the present embodiment is not limited to what is mentioned above, and which may include various arrangements. For example, while the coverage area of the doped regions 390 is dramatically reduced, the disposing area of the plugs 350 may also be reduced thereby. In one embodiment, there is no plug disposed in the region where the depletion region is generated incompletely by the doped regions 390, to increase the resistance of the said region so as to improve the reversed blocking ability of the said region thereby. As shown in FIG. 7, the plugs 350 may be evenly disposed on entire surfaces of the doped regions 390 (including the first doped regions 391 and the second doped regions 393), and also disposed on surfaces of the semiconductor substrate 100 adjacent to the doped regions 390, to form electrical connection. On the other hand, no plug is disposed on surfaces of the semiconductor substrate 100 where is far away from the doped regions 390, for example the center of each grid area 390a, to increase the resistance thereof.

Figure 8:
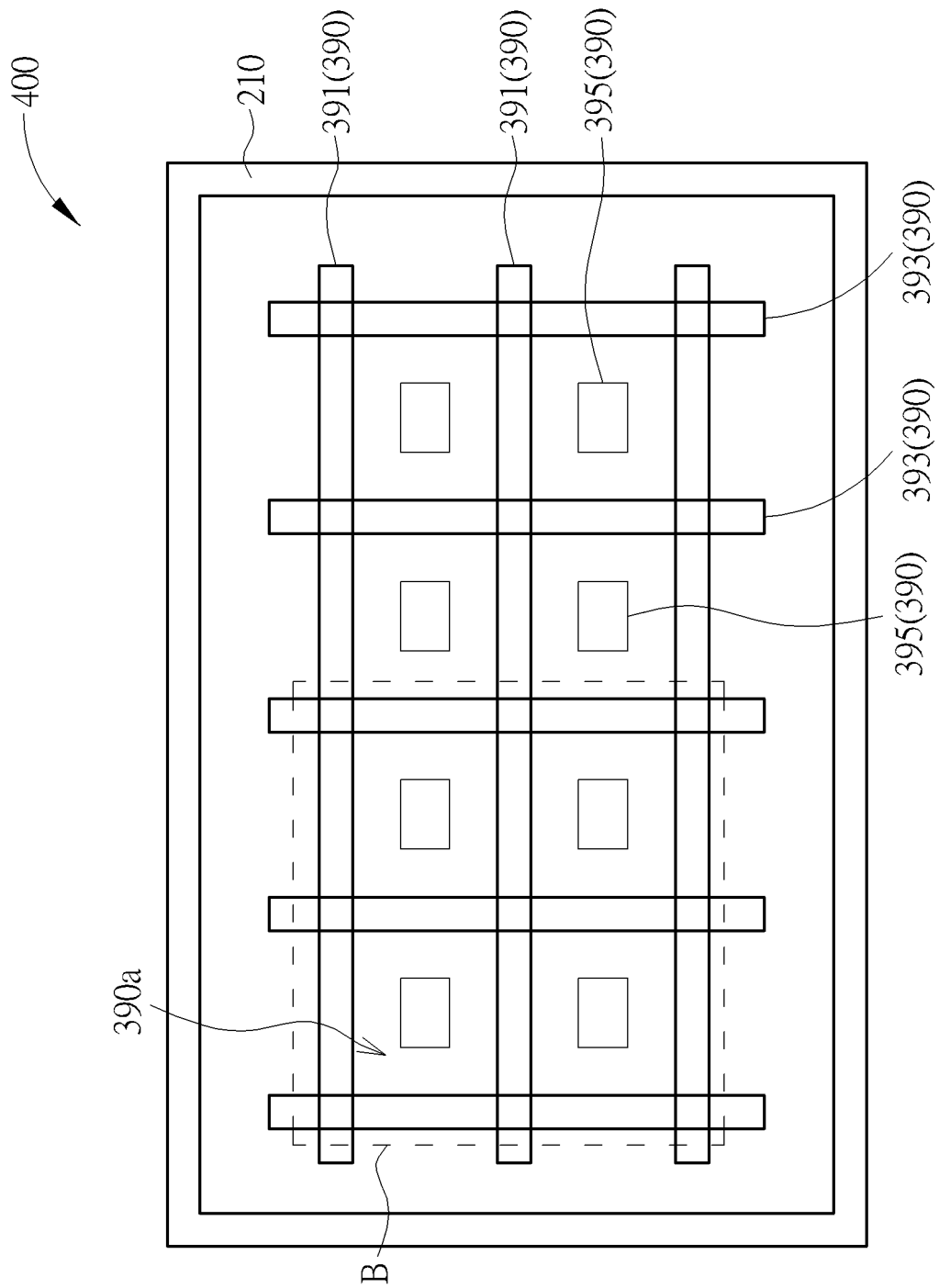
FIG. 8 is a schematic diagram illustrating a top view of a semiconductor device according to a second embodiment of the present disclosure.
Figure 9:
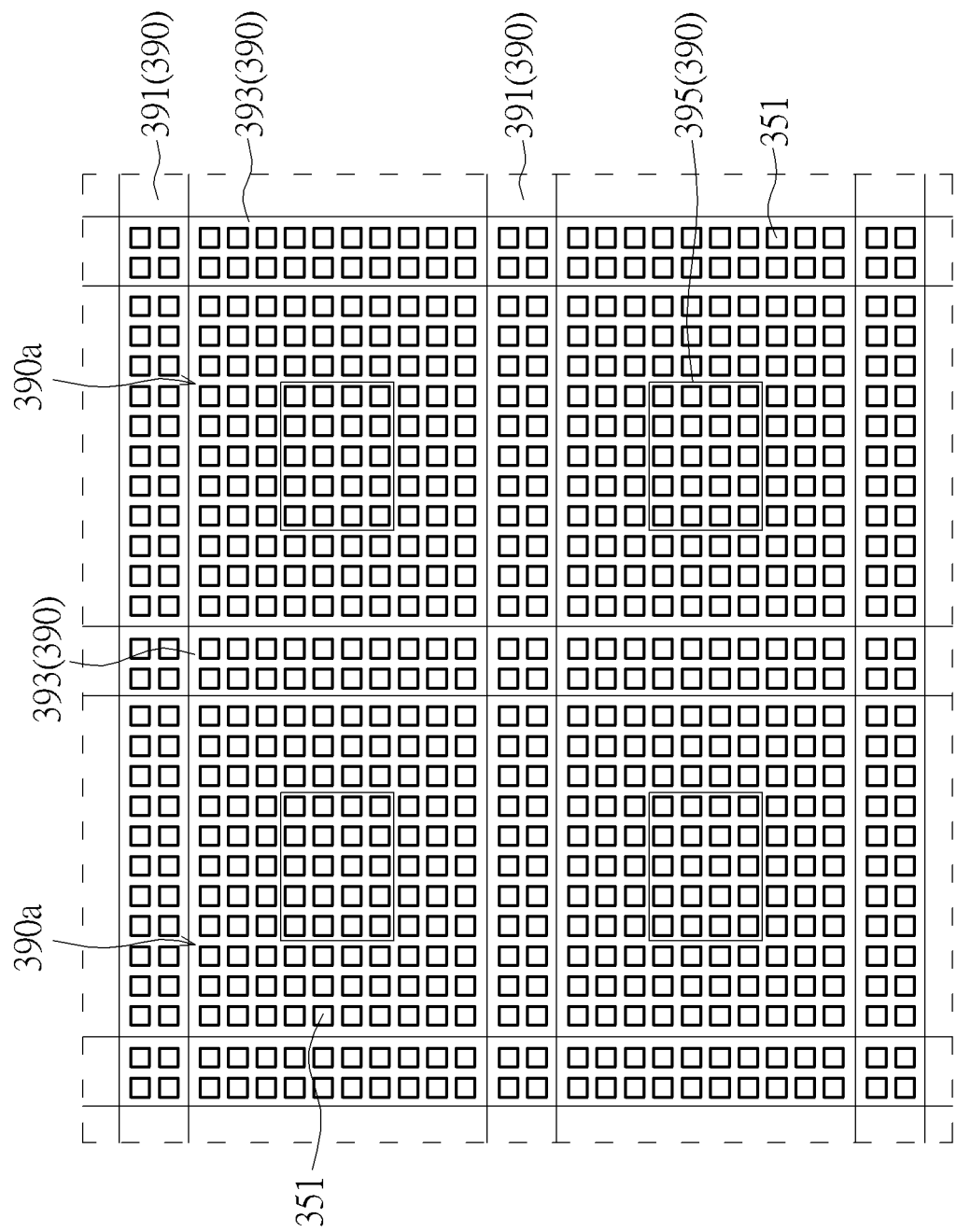
FIG. 9 shows an enlarged view of a dotted frame B in FIG. 8.

Please refers to FIG. 8 to FIG. 9, which illustrate a top view of the semiconductor device 400 according to the second embodiment of the present disclosure. Features in the semiconductor device 400 of the present embodiment is substantially similar to those in the semiconductor device 300 of the aforementioned embodiment, and which also includes the semiconductor substrate 110 (including the silicon substrate 115 and the epitaxial layer 117), the Schottky layer 130, the conductive layer 150, the another conductive layer 170 and the guard ring structure 210, thereby forming a Schottky diode element. The similarity between the present embodiment and the aforementioned embodiment will not be redundantly described hereinafter. The difference between the present embodiment and the aforementioned embodiment is mainly in that the Schottky diode element of the present embodiment further includes a plurality third doped regions 395.

Precisely, speaking, the third doped regions 395 are also disposed in the semiconductor substrate 110 (namely in the epitaxial layer 117 of the present embodiment), adjacent to the top surface 111. The third doped regions 395 include the second conductive type (P-type). It is noted that each of the doped regions 395 is preferably disposed within each of the grid areas 390a through a top view as shown in FIG. 8. Also, each of the doped regions 395 is separately from the first doped regions 391 and the second doped regions 393 to ensure the depletion regions generated by the PN junction of the doped regions 390 (including the first doped regions 391, the second doped regions 393 and the third doped regions 395) respectively may contact to or overlap with each other when the reversed voltage is applied to the Schottky diode element. Therefore, the high leakage current issue at the reverse bias mode may be sufficiently improved. On the other hand, although the third doped regions 395 are additionally disposed in the present embodiment, the coverage area of the doped regions 390 may be still reduced in comparison with the coverage area of the doped regions 190 of the comparison embodiment. In other words, the sum area of the semiconductor substrate 110 (namely the epitaxial layer 117 of the present embodiment) without disposing the doped regions 390 (including the first doped regions 391, the second doped regions 393 and the third doped regions 395) may be relatively increased thereby, for example being increased about 1% to 5%, preferably being about 2%, in comparison with that of the semiconductor device 100 of the aforementioned embodiment, but not limited thereto. In addition, plugs 351 of the present embodiment may be evenly disposed on the entire surfaces of the doped regions 390 (including the first doped regions 391, the second doped regions 393 and the third doped regions 395) and the semiconductor substrate 110, as shown in FIG. 9, but not limited thereto.

Through these arrangements, the semiconductor device 400 of the present embodiment may obtain a greater driving current at the same forward bias mode due to the increased area of the semiconductor substrate 110, and also obtain a further smaller cutting-off current at the reverse bias mode due to additionally disposing the third doped regions 395, thereby achieving better device performance.

Figure 10:
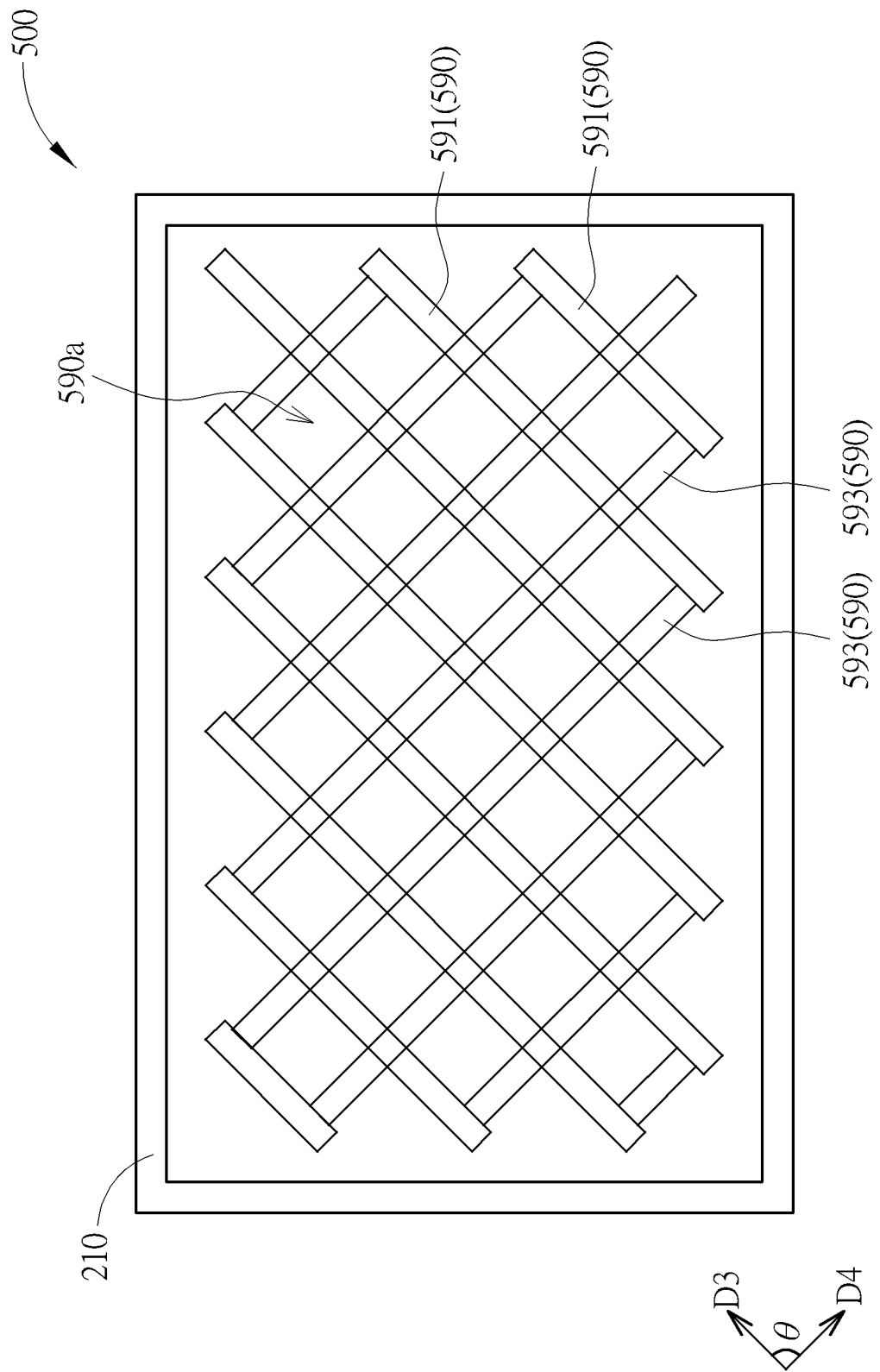
FIG. 10 is a schematic diagram illustrating a semiconductor device according to a third embodiment of the present disclosure.

Please refers to FIG. 10, which illustrate a top view of the semiconductor device 500 according to the third embodiment of the present disclosure. Features in the semiconductor device 500 of the present embodiment is substantially similar to those in the semiconductor device 300 of the aforementioned embodiment, and which also includes the semiconductor substrate 110 (including the silicon substrate 115 and the epitaxial layer 117), the Schottky layer 130, the conductive layer 150, the another conductive layer 170 and the guard ring structure 210, thereby forming a Schottky diode element. The similarity between the present embodiment and the aforementioned embodiment will not be redundantly described hereinafter. The difference between the present embodiment and the aforementioned embodiment is mainly in that the Schottky diode element of the present embodiment includes a plurality doped regions 590 which are extended along different directions D3, D4 to interleave with each other, and the two direction D3, D4 cross to each other without being perpendicular to each other.

Precisely, speaking, the doped regions 590 of the Schottky diode element further include a plurality of first doped regions 591 and a plurality of second doped regions 593. Each of the first doped regions 591 is for example a stripe-shaped doped region extended along the third direction D3, and the first doped regions 591 are arranged parallel along the fourth direction D4. Each of the second doped regions 593 is for example a stripe-shaped doped region extended along the fourth direction D4, and the second doped regions 593 are arranged parallel along the third direction D3. In addition, the second doped regions 593 cross to the first doped regions 591 to further define a plurality of grid areas 590a in the semiconductor substrate 110, as shown in FIG. 10. It is noted that, the third direction D3 interlaces with the fourth direction D4 without being perpendicular to each other, and an angle θ between the third direction D3 and the fourth direction D4 is for example an acute angle greater than 0 degree and smaller than 90 degrees, preferably being about 60 degrees, but not limited thereto. In this way, each of the grid areas 590a may slightly have a parallelogram shape through a top view as shown in FIG. 10, and the doped regions 590 of the Schottky diode element may still perform a waffle type layout, but not limited thereto.

With such arrangement, a depletion region (not shown in the drawings) generated by the PN junction of the doped regions 590 correspondingly may also enlarge both in the third direction D3 and in the fourth direction D4 simultaneously, when a reversed voltage is applied to the Schottky diode element, thereby obtaining a relative greater coverage area. Accordingly, the sum area of the doped regions 590 may be relatively reduced, and correspondingly, the sum area of the semiconductor substrate 110 (namely the epitaxial layer 117 of the present embodiment) without disposing the doped regions 590 may be relatively increased thereby, for example being increased about 10% to 20%, preferably being about 11%, in comparison with that of the semiconductor device 100 of the aforementioned embodiment, but not limited thereto. Through these arrangements, the semiconductor device 500 of the present embodiment may obtain a greater driving current at the forward bias mode due to the increased coverage area of the semiconductor substrate 110, and also obtain a smaller cutting-off current at the reverse bias mode due to effectively disposing the doped regions 590, thereby achieving better device performance.

In summary, the semiconductor device of the present disclosure disposes grid-shaped or interleaved P-type doped regions in an N-type semiconductor substrate, to balance the coverage area of the N-type semiconductor substrate related to the P-type doped regions. In this way, the requirements of greater driving current at the forward bias mode and smaller cutting-off current at the reverse bias mode are simultaneously achieved. In other words, the coverage area of the N-type semiconductor substrate is positively related to the driving current at the forward bias mode. When the coverage area of the N-type semiconductor substrate is larger, the driving current of the semiconductor device is also larger correspondingly at the forward bias mode. The coverage area of the P-type doped regions is negatively related to the cutting-off current at the reverse bias mode. When the coverage area of the P-type doped regions is larger, the cutting-off current of the semiconductor device at the reverse bias mode is smaller correspondingly at the reverse bias mode. Thus, the semiconductor device of the present disclosure may utilizes the coverage area of the N-type semiconductor substrate related to the P-type doped regions by disposing the P-type doped regions which are extended along different directions to interleave with each other, further in combination with the disposing of plugs, to achieve the practical requirements of device performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a semiconductor substrate, the semiconductor substrate comprising a first conductive type;
    a Schottky layer, disposed on the semiconductor substrate;
    a plurality of first doped regions, the first doped regions comprising a second conductive type and disposed in the semiconductor substrate, the second conductive type being complementary to the first conductive type, and the first doped regions are extended parallel along a first direction;
    a plurality of second doped regions, the second doped regions comprising the second conductive type and disposed in the semiconductor substrate, wherein the second doped regions are extended parallel along a second direction to cross the first doped regions, and the first doped regions are interleaved with the second doped regions to define a plurality of grid areas;
    a first conductive layer disposed on the Schottky layer; and
    a second conductive layer disposed under the semiconductor substrate.

2. The semiconductor device accordingly to claim 1, wherein the Schottky layer directly contacts the first doped regions and the second doped regions.

3. The semiconductor device accordingly to claim 1, wherein the semiconductor substrate further comprising: a silicon substrate, the silicon substrate comprising the first conductive type; and an epitaxial layer, the epitaxial layer comprising the first conductive type and disposed on the silicon substrate.

4. The semiconductor device accordingly to claim 3, wherein a doped concentration of the epitaxial layer is less than a doped concentration of the silicon substrate.

5. The semiconductor device accordingly to claim 1, further comprising:
    a plurality of third doped regions, the third doped regions comprising the second conductive type and disposed in the grid areas.

6. The semiconductor device accordingly to claim 5, wherein each of the third doped regions is separated from the first doped regions and the second doped regions.

7. The semiconductor device accordingly to claim 1, further comprising:
    a plurality of plugs disposed on the first conductive layer.

8. The semiconductor device accordingly to claim 7, wherein the plugs are not disposed on a portion of the grid areas.

9. The semiconductor device accordingly to claim 1, further comprising:
    at least one guard ring structure comprising the second conductive type and disposed in the semiconductor substrate, the guard ring structure surrounding the first doped regions and the second doped regions.

10. The semiconductor device accordingly to claim 1, wherein the first doped regions and the second doped regions comprise a same doped concentration.

11. The semiconductor device accordingly to claim 1, wherein a number of the first doped regions is the same as a number of the second doped regions.

12. The semiconductor device accordingly to claim 1, wherein the first direction is perpendicular to the second direction.

13. The semiconductor device accordingly to claim 1, wherein the first direction intersects the second direction but not perpendicular to the second direction.

14. The semiconductor device accordingly to claim 1, wherein the first doped regions and the second doped regions are stripe-shaped.

* * * * *